(12) United States Patent
Pukhovski

(10) Patent No.: US 7,994,862 B1
(45) Date of Patent: Aug. 9, 2011

(54) CIRCUIT AND METHOD OF TEMPERATURE DEPENDENT POWER AMPLIFIER BIASING

(75) Inventor: Anatoli Pukhovski, Ottawa (CA)

(73) Assignee: SiGe Semiconductor Inc., Ottawa, Ontario (CA)

( * ) Notice: Subject to any disclaimer, the term of this patent is extended or adjusted under 35 U.S.C. 154(b) by 0 days.

(21) Appl. No.: 12/704,095

(22) Filed: Feb. 11, 2010

(51) Int. Cl.
 *H03F 3/04* (2006.01)
(52) U.S. Cl. .................. 330/289; 330/296; 330/285
(58) Field of Classification Search .................. 330/289, 330/296, 285
 See application file for complete search history.

(56) References Cited

U.S. PATENT DOCUMENTS

| | | | |
|---|---|---|---|
| 6,661,290 B2 * | 12/2003 | Sugiura | 330/289 |
| 6,831,511 B2 * | 12/2004 | Hollingsworth et al. | 330/124 R |
| 6,958,649 B2 * | 10/2005 | Nagamori et al. | 330/133 |
| 7,215,204 B2 * | 5/2007 | Bambridge et al. | 330/307 |
| 7,256,653 B2 * | 8/2007 | Maya et al. | 330/289 |
| 7,733,186 B2 * | 6/2010 | Hosoya et al. | 330/296 |

* cited by examiner

*Primary Examiner* — Patricia Nguyen
(74) *Attorney, Agent, or Firm* — Freedman & Associates

(57) ABSTRACT

A circuit and method are provided for reducing dynamic EVM of a power amplifier (PA) used for RF communication. A temperature dependent boost bias signal is applied to the bias input port of amplifier circuitry of the PA in dependence upon a temperature of the amplifier circuitry to compensate for transience in the gain or phase response of the PA while components of the PA is differentially warming-up, advantageously taking into account an actual temperature of the amplifier circuitry.

26 Claims, 4 Drawing Sheets

CIRCUIT AND METHOD OF TEMPERATURE DEPENDENT POWER AMPLIFIER BIASING

FIELD OF THE INVENTION

The invention relates to power amplifiers (PA), and more particularly to reduction of gain and phase variance of a PA and hence reduction of dynamic error vector magnitude of amplified signals.

BACKGROUND OF THE INVENTION

One consideration for the performance of a power amplifier is its ability to exhibit the gain and phase response which is requested and/or expected of it. In most applications, a temporal variance of the gain and phase response of a PA from what is required and expected is undesirable. An input signal to the PA experiences amplification in accordance with the expected gain and the phase of the signal may be shifted. A temporal variance in the gain or phase shift experienced by the input signal results in a temporal variance in both the magnitude and phase of the output signal.

In a PA used in an RF transmitter or transceiver for RF communication, one measure of the error in the gain and phase response exhibited by a PA is what is known as the error vector magnitude (EVM) of the RF signals transmitted. The EVM is characterized by the magnitude of error in the transmitted signal symbol's constellation points versus the constellation point locations of the input signal symbol. The EVM performance of a PA can be measured in terms of the contribution to the EVM of the transmitter created by the amplification applied by the amplifier. All PA's contribute to the EVM to some degree as no PA is an ideal amplifier. Keeping the EVM caused by a PA as small as possible is an important goal in the design and manufacture of PAs.

The EVM of a PA can increase under pulsed conditions. Dynamic EVM is a measure of this increased EVM under these conditions. A significant contributor to dynamic EVM is variance in at least one of the gain or phase response of the PA when the PA is experiencing transience, particularly during transitions from idle to steady-state PA operating conditions.

Under steady-state operating conditions, the PA generally behaves in an expected, well behaved, and settled manner. Most PAs are designed and tuned such that, under steady-state conditions, if a specific bias current (or voltage) is applied to its amplifying circuitry from associated biasing circuitry, it amplifies a signal with a predetermined and settled gain and phase response. This invariance of gain and phase response holds in general if the PA is operating under steady-state operating conditions, but does not necessarily apply under changing operating conditions such as at initial biasing or PA turn-on.

Not surprisingly, changing operating conditions can lead to changing electromagnetic, electrical, and other physical characteristics of the PA, its constituent components, or its associated circuitry. Changes in these physical characteristics can lead to an exhibited gain or phase response of the PA which does not correspond to that which normally accompanies the specific bias being applied to the PA. If a physical characteristic of the PA fluctuates, and if the gain or phase response of the PA is affected by that physical characteristic, so will the exhibited signal amplification response of the PA. As such, changing the operating conditions or operating point of the PA can lead to changes in the gain or phase response of the PA. For example, transitioning from an idle state to a full-on state can create a host of various, and possibly interdependent or causally related physical changes which lead to temporal variance in the gain response of the PA and increased dynamic EVM, during the transition period. One important operating condition which affects the gain or phase response of the PA and which changes rapidly during transitions from an idle state to a full on-state is temperature.

In order to ensure low dynamic EVM and provide for an output signal that is not distorted by gain or phase variance, a PA is generally not used unless it is thermally settled. A common approach to avoid the problem of dynamic EVM is simply to wait until a PA is thermally settled before using it to amplify the signal. This approach may not be acceptable in the context of various radio transmission standards such as IEEE 802.11. A second common approach is to reduce the time needed to achieve a steady state in respect of the amplification characteristics of the PA ("settling time") by applying an external resistor and speed-up capacitor to provide more forward current earlier to the PA. Although the speed-up capacitor can improve the settling time of the PA, as a passive mechanism it cannot provide the additional forward current until the RF input signal itself arrives. Consequently, the beginning of the RF signal data will suffer from some amount of dynamic EVM and the additional current may not be sufficient to bring the PA into a thermally settled state at a desired rate.

The external passive networks according to the known solutions possess various packaging and performance compromises. Use of the speed-up capacitor requires additional package pins to connect the capacitor across the bias reference current internal port. Any solution utilizing fixed external passive networks requires extensive fine tuning and optimization in the prototype phase. Waiting for a PA and its associated circuitry to warm-up and become thermally settled before using it, although avoiding dynamic EVM, introduces undesirable delay.

SUMMARY OF THE INVENTION

According to a first aspect, the invention provides for a method of biasing in a power amplifier, the method comprising: measuring a temperature of amplifier circuitry of the power amplifier with use of a temperature sensor located proximate the amplifier circuitry generating at least one temperature measurement; generating a temperature dependent bias signal in dependence upon the at least one temperature measurement; providing the temperature dependent bias signal to a bias input port of the amplifier circuitry, wherein the temperature dependent bias signal has a magnitude other than a magnitude of a standard bias signal generated in dependence upon at least one standard temperature measurement generated from at least one of a measurement of a temperature of a bias circuit of the power amplifier and a measurement representative of a temperature of the power amplifier, and wherein the temperature dependent bias signal is sufficient to bias the amplifier circuitry to a desired gain and phase.

According to another aspect, the invention provides for a circuit for a power amplifier, the circuit comprising: temperature sensing circuitry comprising a temperature sensor located proximate amplifier circuitry of the power amplifier for measuring a temperature of the amplifier circuitry, the temperature sensing circuitry for generating at least one temperature measurement; and bias circuitry connected to the temperature sensing circuitry and for generating a temperature dependent bias signal in dependence upon the at least one temperature measurement, and for providing the temperature dependent bias signal to a bias input port of the amplifier circuitry, wherein the temperature dependent bias signal has a magnitude other than a magnitude of a standard bias signal generated in dependence upon at least one standard temperature measurement generated from at least one of a measurement of a temperature of the bias circuitry and a measurement representative of a temperature of the power amplifier, and wherein the temperature dependent bias signal is sufficient to bias the amplifier circuitry to a desired gain and phase.

According to yet another aspect, the invention provides for a circuit for a power amplifier for RF communication, the circuit comprising: temperature sensing circuitry for sensing a temperature of integrated amplifier circuitry of the power amplifier, and for generating a temperature signal in dependence upon said temperature, the temperature sensing circuitry comprising a temperature sensor formed in an integrated chip die material in which the amplifier circuitry is integrated and located proximate the amplifier circuitry; and a temperature dependent bias circuit for generating a temperature dependent bias signal in dependence upon the temperature signal, the temperature dependent bias circuit coupled to a bias input port of the amplifier circuitry and for providing the temperature dependent bias signal to the bias input port, wherein the temperature dependent bias signal has a magnitude other than a magnitude of a standard bias signal generated in dependence upon at least one standard temperature measurement generated from at least one of a measurement of a temperature of the bias circuitry and a measurement representative of a temperature of the power amplifier, and wherein the temperature dependent bias signal is sufficient to bias the amplifier circuitry to a desired gain and phase.

According to a further aspect, the invention provides for a method of biasing in a power amplifier for RF communication, the method comprising: generating a temperature signal in dependence upon a temperature of first amplifier circuitry of a first amplification stage of the power amplifier with use of a temperature sensor located proximate the first amplifier circuitry; generating a temperature dependent bias signal in dependence upon the temperature signal; and providing the temperature dependent bias signal to a bias input port of second amplifier circuitry of a second amplification stage of the power amplifier, wherein the temperature dependent bias signal is generated and output to the bias input port of the second amplifier circuitry, wherein the temperature dependent bias signal has a magnitude other than a magnitude of a standard bias signal generated in dependence upon at least one standard temperature measurement generated from at least one of a measurement of a temperature of the bias circuitry and a measurement representative of a temperature of the power amplifier, and wherein the temperature dependent bias signal is sufficient to bias the second amplifier circuitry to a desired gain and phase.

BRIEF DESCRIPTION OF THE DRAWINGS

The features and advantages of the invention will become more apparent from the following detailed description of the preferred embodiment(s) with reference to the attached figures, wherein.

Figure 1:
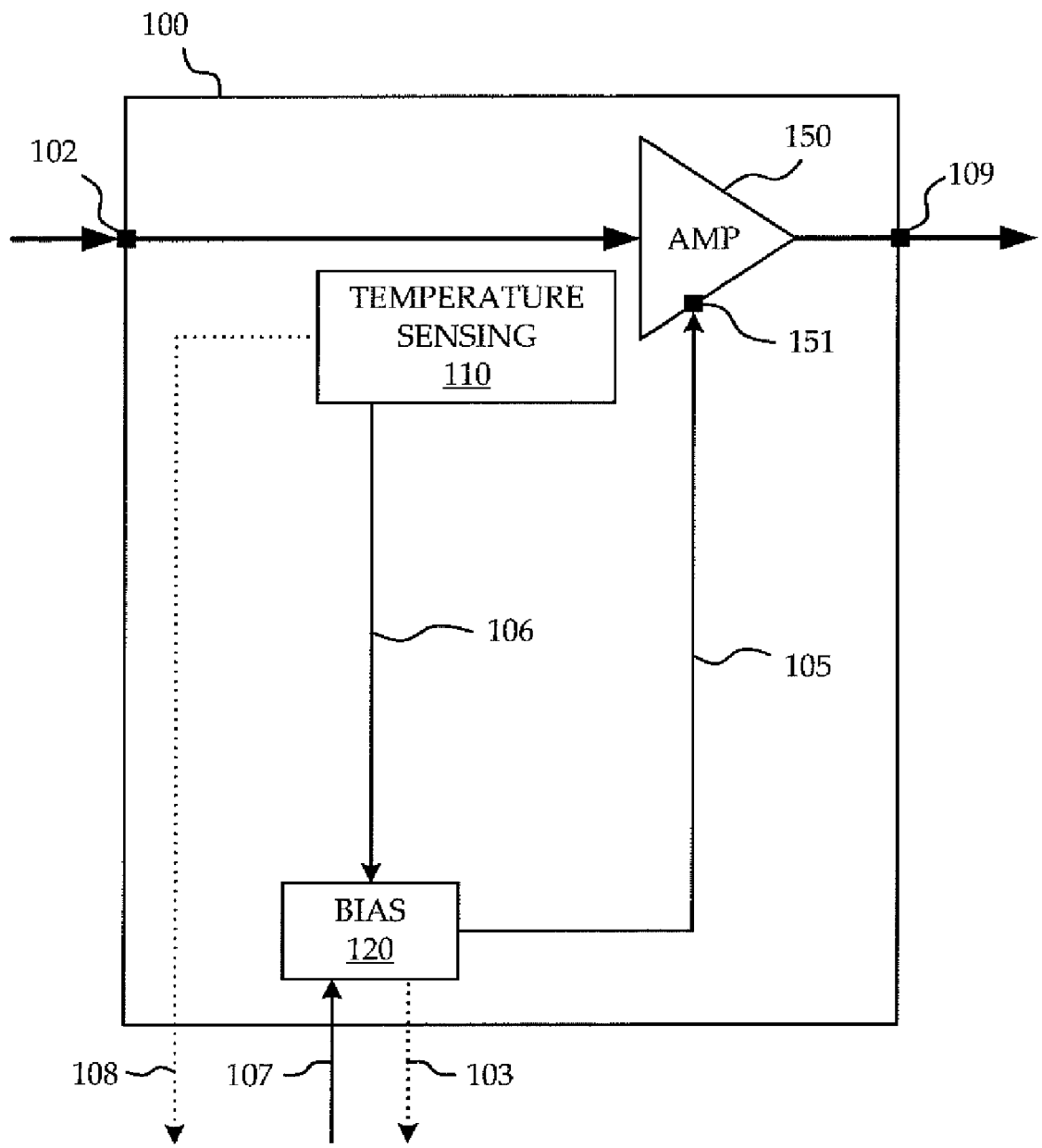
FIG. 1 is a block diagram of a power amplifier including temperature sensing circuitry according to an embodiment of the invention.

It is noted that in the attached figures, like features bear similar labels.

DETAILED DESCRIPTION OF THE PREFERRED EMBODIMENTS

The embodiments described below illustrate features of the invention in the context of an Integrated Chip (IC) power amplifier. It is to be understood that the invention applies to a power amplifier of any type, including among others, a power amplifier which is FET based, tube based, or any combination thereof, as long as the power amplifier utilizes biasing voltage or current signals to set the gain and phase response of its amplification, and would benefit from settling to minimize distortion due to changing gain and phase response during the arrival of the input signal.

The invention described herein below mitigates the aforementioned drawbacks of known systems by limiting the need for external components, improving dynamic EVM performance of PAs, reducing fine tuning and optimization in the prototype phase, and permitting use of the PA to amplify RF signals passing therethrough without undesirable delays.

Although various fluctuations in physical characteristics caused by changing operating conditions can affect the gain and phase response of the PA, the temperature of the PA has a profound effect on both. It is well known in the art of semiconductor power amplifier design that self-heating when an amplifier is enabled induces a temporal variance in the gain and phase response of the amplifier which settles after a period of time at a constant bias or operating point. In effect, the temperature of the amplifier reaches a value that is consistent with the internal power dissipation. Moreover, in the context of a parallel array of semiconductor transistors operating as a single amplifier, it is also well known that the transistors forming the inner part of the array may have a different temperature and temperature settling profile than those at the ends of the array. In effect, the nearest neighbor contributors of heat have a different impact for transistors at the ends of the array.

One important constituent of the associated circuitry of a PA is the biasing circuitry which controls and generates a biasing signal for controlling a gain and phase response of the amplifying circuitry. It is known in the art to keep track of a temperature of the biasing circuitry or the IC in general by way of a bandgap circuit or other sensor associated therewith in order to provide a biasing signal which is appropriate for the particular steady-state operating temperature being experienced by the IC. Since the gain of the amplifying circuitry varies inversely with its temperature, such temperature tracking is needed to vary the biasing signal with the temperature to compensate for the change in gain. Varying the bias signal in dependence upon the temperature also compensates for changes in phase which may accompany the changes in gain. The gain response of the amplifying circuitry varies with temperature such that at lower temperatures, the actual gain exhibited by the amplifying circuitry is relatively greater, and hence must be biased with a lower bias signal to maintain a desired gain from the PA. If the PA is operating at a higher temperature, the actual gain of the amplifying circuitry is relatively lower, and hence must be biased with a higher bias signal to maintain a desired gain from the PA. In order to achieve a desired target operating gain and phase, the standard or steady-state bias level is constantly adjusted to compensate for a temperature of the IC as measured at the biasing circuitry or at some bandgap sensor associated therewith.

In known PAs, the biasing circuitry and temperature compensating circuitry are placed at a relatively large distance from the amplifying circuitry, with the purpose of measuring an average, or smoothed out measurement, of the steady-state operating temperature. This measurement, in effect, arises from a thermal signal which has propagated over the relatively large distance through semiconductor material, which acts as a low pass thermal filter, so that the well behaved average temperature of the IC die can be determined.

Due to its affect on the gain and phase response of the PA and its associated circuitry, one main contributor to dynamic EVM is thermal unsettling of the PA and its associated circuitry caused by rapid dynamic heating effects. Under pulsed conditions, the temperature of the amplifying circuitry of the PA fluctuates between idle temperatures and steady-state operating temperatures very quickly, which in turn causes variations in the gain and phase response of the amplifying circuitry. One particular situation for which this can occur, is when the PA receives an RF signal data burst, after it has remained idle long enough such that its temperature has fallen below steady-state operating temperatures. In one standard RF transmitter application, a Tx enable is received 500 ns to 1 µs before the RF signal data to be transmitted is received.

Since the temperature measured by known biasing circuitry is located relatively far away from the amplifying circuitry, for a short time immediately after turn on time and reception of signal data, the temperature measured by the biasing circuitry is actually much lower than that actually experienced by the amplifying circuitry. A consequence is that a biasing level applied by the biasing circuitry, one which is applied for a lower temperature than the actual temperature, is too low to achieve the desired gain. As the temperature of the IC and the biasing circuitry or the bandgap sensor approaches that of the amplifying circuitry, the biasing signal provided by the biasing circuitry becomes better suited to bias the amplifying circuitry. Once steady-state operating conditions have been met, and the temperature of the IC at the biasing circuitry or the bandgap sensor has reached that of the amplifying circuitry, the biasing signal provide by the biasing circuit is appropriate for achieving the desired gain and phase from the amplifying circuitry.

Due to the length time it takes for this to occur, some of the RF signal data may be received and amplified while the PA and its circuitry is in a thermally un-settled state during which temperature of the amplifying circuitry and the biasing circuit are unmatched and hence the gain and phase response of the amplifier and its associated circuitry is still changing. This occurs primarily at the beginning of the pulse sequence, when the biasing circuitry or the associated bandgap sensor is coolest and hence at a temperature farthest from the actual temperature of the amplifying circuitry.

Embodiments described hereinbelow utilize a temperature sensor located proximate the amplifying circuitry of the PA to provide a more accurate real-time measurement of the actual temperature experienced by the amplifying circuitry in order to provide an appropriate level of biasing to achieve the desired gain and phase response. In some embodiments the temperature sensor is located 100 µm or closer to the amplifying transistor which is some five times closer than the standard distance of a known biasing block which would be located at and hence measure a temperature at as far away as 500 µm.

Referring to FIG. 1, a PA 100 having temperature dependent controlled biasing circuitry according to the invention will now be described in terms of structure. The PA 100 has an RF input port 102 which is coupled in series with an amplifier 150 (AMP) and an RF output port 109 of the PA 100. The amplifier 150 is coupled at a bias input port 151 of the amplifier 150 over a bias connection 105 to bias circuitry 120 (BIAS) which includes additional bias circuitry controlled by temperature sensing circuitry 110 to improve dynamic EVM performance of the PA 100 as described below. At least some portion of the temperature sensing circuitry 110 is located close to the amplifier 150. The bias circuitry 120 is coupled via control lines 107 to one or more bias controllers (not shown). In some embodiments, the control lines 107 comprise serial connections and in other embodiments the control lines 107 comprise parallel connections. In some embodiments the temperature sensing circuitry 110 is coupled via a temperature measurement output line 106 to the bias circuitry 120. Optionally, the temperature sensing circuitry 110 is coupled via temperature measurement output connection or connections 108 to the one or more controllers, in which case the temperature sensing circuit 110 need not be directly connected to the bias circuitry 120 via the temperature measurement output line 106. In such an embodiment the bias circuitry 120 may be connected via a standard temperature measurement output connection or connections 103 to the one or more controller or controllers.

In some embodiments, the PA is a multistage power amplifier, wherein one or more of the stages include the temperature sensing circuitry 110 and the bias circuitry 120 according to the embodiments described herein.

The PA 100 of FIG. 1 will now be described in terms of its function. The PA 100 receives over the RF input port 102 an RF input signal for amplification. The RF input signal is passed through the amplifier 150 and a resulting amplified RF output signal is output from the PA 100 over the RF output port 109. The temperature sensing circuitry 110 measures a temperature of the amplifier 150, and generates temperature measurements therefrom. These temperature measurements are used to control the biasing applied by the bias circuitry 120.

In operation, the amplifier 150 is biased by the bias circuitry 120, which in turn is controlled by one or more bias controllers over the control lines 107.

In some embodiments, the bias circuitry 120 uses the temperature measurements it receives directly from the temperature sensing circuitry 110 to generate the biasing signal it outputs over the bias connection 105.

Optionally, the temperature sensing circuit 110 does not directly send the temperature measurements to the bias circuitry 120, but instead provides the temperature measurements to the one or more bias controllers over the temperature measurement output connection or connections 108. In this embodiment the bias circuit 120 may provide over the standard temperature measurement connection or connections 103, a standard temperature measurement which could be a measurement of the IC die temperature which it performs locally or with use of some centrally or otherwise located bandgap sensor.

The biasing applied by the bias circuitry 120 to the amplifier 150 depends upon the measured temperature of the amplifier 150. In some embodiments, the bias circuitry 120 does not have any form of self temperature measurement circuitry instead, relying completely upon the temperature measured by the temperature sensing circuit 110 to generate the appropriate biasing. In other embodiments, the bias circuitry 120 measures locally, centrally, or otherwise a temperature of the PA 100 to determine a standard bias signal and augments the standard bias signal with a boost bias determined from a difference between the temperature of the amplifier 150 and the temperature measurements of the bias circuitry 120. In other embodiments, the controller or controllers control the level of biasing of the bias circuitry 120 with use of temperature dependent bias control signals generated in dependence upon the temperature measurements it receives over the temperature measurement output connection or connections 108, and the standard temperature measurement connection or connections 103.

Standard and well known forms of biasing enable the manipulation of various characteristics of the amplifier 150 for various purposes. For the purposes of the embodiment shown, the type of biasing of interest is that applied in addition to the standard steady-state biasing, namely, the bias applied by the bias circuitry to the amplifier in order to compensate for the transient bias levels while the temperature of the standard bias circuit is warming up to the temperature of the amplifier 150, while advantageously taking into account the measured temperature of the amplifier 150.

Figure 2A:
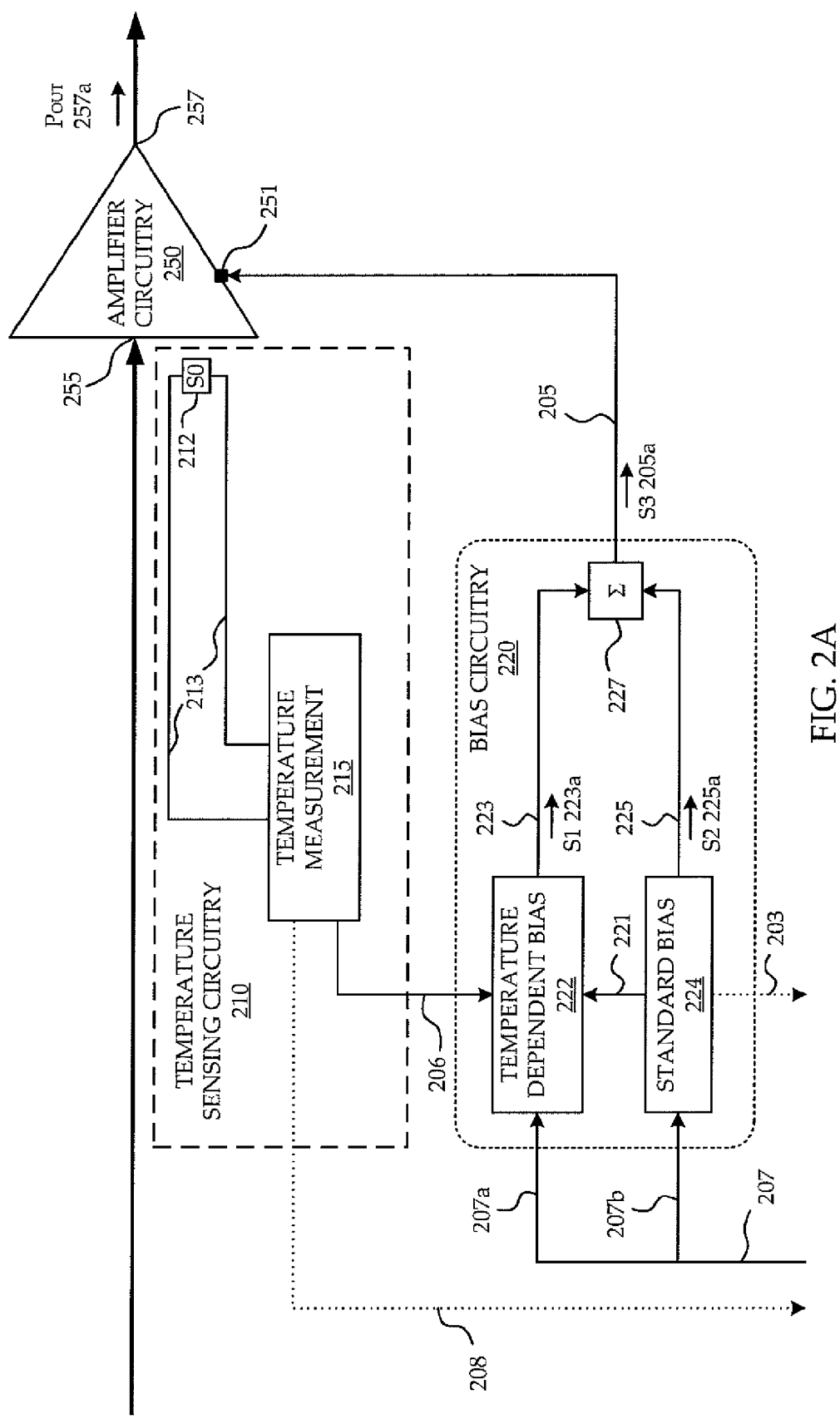
FIG. 2A is a block diagram illustrating temperature dependent biasing of a power amplifier according to an embodiment of the invention.

Referring now also to FIG. 2A an embodiment which includes the aforementioned additional circuitry for improving dynamic EVM will now be described in terms of its structure. Bias circuitry 220 of the embodiment depicted in FIG. 2A forms part of the bias circuitry 120 of the PA 100 of FIG. 1, while temperature sensing circuitry 210 of the embodiment depicted in FIG. 2A forms part of the temperature sensing circuitry 110 of the PA 100 of FIG. 1.

Temperature sensing circuitry 210 comprises a temperature measurement generator 215 which is coupled by temperature measurement connections 213 to a temperature sensor 212. The temperature sensor 212 of the embodiment depicted in FIG. 2A is located proximate to amplifier circuitry 250 described hereinbelow and may comprise a semiconductor diode or any other temperature measuring sensor having the appropriate sensitivity and response. In some embodiments the temperature sensor is a thermo-couple constructed using different metals in the metal stack above the emitter or gate of amplifier circuitry 250. Alternatively, a resistivity or capacitance of an elemental device which varies with temperature in a known way may be used as the basis for a temperature measurement.

Bias circuitry 220 comprises a temperature dependent bias circuit 222, a standard bias circuit 224, and a combiner 227. The temperature dependent bias circuit 222 and the standard bias circuit 224 are each independent open loop current sources which have very rapid enable capability. The temperature dependent bias circuit 222 is coupled by a first connection 223 to the combiner 227. The temperature measurement generator 215 is connected via a temperature measurement output line 206 to the temperature dependent bias circuit 222. The standard bias circuit 224 is coupled by a standard temperature measurement output line 221 to the temperature dependent bias circuit 222. The standard bias circuit 224 is coupled by a second connection 225 to the combiner 227. Bias control lines 207 comprise first and second bias control connections 207a, 207b which respectively couple the temperature dependent bias circuit 222 and the standard bias circuit 224, to the bias controller or controllers.

An output port of the combiner 227 is coupled to a bias input port 251 of the amplifier circuitry 250 over a bias connection 205. The amplifier circuitry 250 forms part of the amplifier 150 of the PA 100 of FIG. 1. The temperature sensor 212 of the temperature sensing circuitry 210 is located proximate to the amplifier circuitry 250 in order to accurately measure a temperature of the amplifier circuitry 250. The amplifier circuitry 250 has an input port 255 and an output port 257 for respectively receiving and transmitting the RF signal passing through the PA 100.

In an alternative embodiment, the temperature measurement generator 215 is connected via temperature measurement output connection or connections 208 to a bias controller or controllers (not shown), but is not connected to the temperature dependent bias circuit 222. In this embodiment, the standard bias circuit 224 is connected to the bias controller or controllers over standard temperature measurement output connection or connections 203.

The embodiment depicted in FIG. 2A will now be described in terms of function.

The temperature sensing circuitry 210 measures a temperature of the amplifier circuitry 250 and generates a temperature measurement which is used to control a total biasing signal 205a (S3) provided to the amplifier circuitry 250.

The temperature measurement generator 215 measures with use of the temperature measurement connections 213 characteristics of the temperature sensor 212 which change with temperature. One example of such a characteristic, in a case where the temperature sensor 212 is a diode, is the current passing through the diode at a fixed forward bias. As a temperature of the diode increases, the current passing through the diode at a fixed bias also increases. It is known that the voltage curve for a diode when forward biased shifts positively by 2 mV per degree Celsius increase in temperature. Another example of such a characteristic, also in the case where the temperature sensor 212 is a diode, is a voltage at an emitter of the diode when the diode is input with a constant voltage source at its collector. It is well known that in such a configuration, the voltage measured at the emitter of the diode decreases in a generally linear fashion with increasing temperature. Alternatively, the current could be fixed into the diode through to ground at the transistor's emitter and the voltage across the diode could be measured.

In some embodiments the temperature sensor 212 comprises an integrated semiconductor diode which is formed in the same integrated chip die as the amplifying circuitry 250 at an adjacent location which is as near as possible thereto within the limits of fabrication, needs of the amplifier circuitry design, and functionality thereof. This affords greater accuracy in measurement of the temperature of the amplifier circuitry, as temperatures resulting from thermal transfer through the integrated chip die material at locations near the amplifier circuitry 250 will be more representative of the actual instantaneous temperature of the amplifier circuitry, than temperatures measured at more remote locations and/or outside of the integrated chip die material.

The bias circuitry 220 is used to generate the total biasing signal 205a (S3) that is output over the bias connection 205 to the amplifier circuitry 250. The total biasing signal received by the amplifier circuitry 250 over bias input port 251 is used to drive, in preferably an open loop configuration, a collector current (ICC) of a collector of an amplifying transistor (not shown) of the amplifier circuitry 250. Various implementations for biasing amplifier circuits with a biasing signal are well known in the art.

The total biasing signal 205a output over the bias connection 205 is a summation generated by the combiner 227 of the signals it receives from the standard bias circuit 224 and from the temperature dependent bias circuit 222.

As soon as the PA 100 begins to receive RF signal data, or alternatively as soon as the PA 100 determines that RF signal data is imminent, the one or more bias controllers initiate the operation of the temperature dependent bias circuit 222 by first bias control signals sent over the first bias control connection 207a. The one or more bias controllers initiate the operation of the standard bias circuit 224 by second bias control signals sent over the second bias control connection 207b at about the same time that the operation of the temperature dependent bias circuit 222 is initiated.

In response to the second bias control signals, the standard bias circuit 224 begins generating a standard bias signal 225a and outputs it over the second connection 225 to the combiner 227. The standard bias circuit 224 generates a standard bias signal 225a in accordance with a specified desired bias level communicated in the second bias control signals sent over the second bias control connection 207b and in accordance with a standard temperature measurement which is a local or centrally located temperature measurement representative of an IC die temperature measured by the standard bias circuit 224.

In response to the first bias control signals, the temperature dependent bias circuit 222 begins generating a temperature dependent boost bias signal 223a and outputs it over the first connection 223 to the combiner 227. The magnitude of the temperature dependent boost bias signal 223a and its variation over time depends upon the temperature measured at the temperature sensor 212.

The temperature measurement generator 215 provides temperature measurements to the temperature dependent bias circuit 222 over the temperature measurement output line 206. The temperature dependent bias circuit 222 has access to a standard temperature measurement via the standard temperature measurement output line 221. The temperature dependent bias circuit 222 uses the temperature measurements received from the temperature measurement generator 215 and the standard bias circuit 224 to determine the magnitude of the temperature dependent boost bias signal 223a it generates.

The standard temperature measurement representative of an IC die temperature which is either centrally or locally measured at the standard bias circuit 224 generally reflects the temperature of the amplifier circuitry 250 up to a time around when the amplifier circuitry 250 begins to warm-up from bias signals applied to its bias input port 251 or RF signals arriving at its input port 255 which occurs when the PA 100 receives a Tx enable or otherwise determines that RF signal data is imminent. Once the amplifier circuitry 250 begins to warm-up, its temperature begins to diverge from the standard temperature measurement measured by the standard bias circuit 224 due to the time it takes for the thermal signal to propagate from the amplifier circuitry 250 to the remote location of the standard bias circuit 224 or the central or other location of a bandgap sensor. As the amplifier circuitry 250 continues to warm-up and even after it has reached its steady-state operating temperature, the temperature measured by the standard bias circuit 224 lags behind the temperature of the amplifier circuitry 250. Specifically, during this time the temperature measured by the standard bias circuit 224 is lower than the temperature of the amplifier circuitry 250. As described hereinabove, in order to maintain a PA at a desired gain and phase, the PA must be biased at higher levels when the PA is at higher temperatures and must be biased at lower levels when the PA is at lower temperatures. Consequently, during this time, the bias signal provided by the standard bias circuit 224 is insufficient to achieve the desired gain and phase and hence must be augmented by an additional amount of bias, namely the temperature dependent boost bias signal 223a provided by the temperature dependent bias circuit 222. The magnitude of the temperature dependent boost bias signal 223a is therefore equal to the shortfall or deficiency in the standard bias signal 225a caused by the remoteness of the standard bias circuit 224 from the amplifier circuitry 250.

The shortfall or deficiency in the standard bias signal 225a is determined by comparing the temperature measurements received from the temperature measurement generator 215 with the standard temperature measurements received from the standard bias circuit 224.

In some embodiments, a magnitude of the standard bias signal 225a which obtains at the standard temperature measurement is differentially compared with a magnitude of the standard bias signal 225a which would obtain were the standard temperature measurement the same as the temperature measured at the amplifier circuitry 250. In these embodiments, this difference in magnitude is used for the magnitude of the temperature dependent boost bias signal 223a.

In other embodiments, a temperature difference between the temperature measured at the amplifier circuitry 250 and the standard temperature measurement is calculated and used to generate a bias signal difference which if added to the standard bias signal 225a would provide the proper biasing signal to achieve the desired gain and phase. In these embodiments this bias signal difference is used for the magnitude of the temperature dependent boost bias signal 223a. The bias signal difference may be calculated using a functional relationship between the temperature difference and the bias signal difference and/or a lookup table which provides the appropriate bias signal difference for any given temperature difference. The calculation of the bias signal difference may also depend upon an absolute temperature in addition to the temperature difference, and for example, could use the absolute value of the standard temperature measurement.

In some embodiments, the time-dependent value of the bias signal difference required to compensate for the erroneous measurement of temperature at the standard bias circuit 224 has been measured and parameterized or otherwise translated into a profile of how the temperature dependent boost bias signal should change over time. In these embodiments, an assessment of the temperatures and of the temperature difference and optionally of a bias signal difference is made at a specific time, for example immediately after the standard bias circuit 224 comes online in response to the PA 100 receiving the Tx enable. Assuming that the temperatures and the temperature difference will evolve in accordance with their specific values from that specific time in a known way, a known profile can be used to vary the temperature dependent boost bias signal over time in such a manner so as to appropriately compensate the shortfall of biasing provided by the standard bias circuit 224. The known profile can be defined as a function of time, and the temperature difference or bias signal difference at the specific time, or it can be a series of profile values in a lookup table.

In other embodiments, the temperature measurement generator 215 measures the instantaneous temperature of the amplifier circuitry 250 continuously and in real-time, generating dynamic temperature measurements which are provided to the temperature dependent bias circuit 222. In these embodiments, the magnitude of the temperature dependent boost bias signal 223a generated by the temperature dependent bias circuit 222 varies as a function of the dynamically measured instantaneous temperature to ensure an ideal power response from the amplifier circuitry 250. In these embodiments, a difference in the biasing signal is calculated in a similar manner as that described above performed continuously over time as the temperatures of the amplifier circuitry 250 and a standard bias circuit 224 or bandgap sensor change.

Regardless of which method is used to measure the temperature of the amplifying circuitry and to calculate the magnitude of the temperature dependent boost bias signal 223a, the temperature dependent boost bias signal 223a will generally take on the form of a quickly rising pulse, reaching a maximum when the difference between the actual temperature of the amplifier circuitry 250 and the temperature of the standard bias circuit 224 or of the bandgap sensor as the case may be, is at a maximum, and falling to 0 as the temperature of standard bias circuit 224 or of the bandgap sensor approaches that of the amplifier circuitry 250.

In embodiments in which the temperature measurement generator 215 is connected via the temperature measurement output connection or connections 208 to the bias controller or controllers (not shown), the temperature measurement generator 215 provides temperature measurements to the bias controller or controllers and not to the temperature dependent bias circuit 222. The bias controller or controllers also have access to a standard temperature measurement representing the IC die temperature which it receives from a centrally located bandgap sensor (not shown) or from the standard bias circuit 224 over the standard temperature measurement output connection or connections 203. In these embodiments, the controller or controllers use the temperature measurements received from the temperature measurement generator 215, and the standard temperature measurement, in a similar manner to that described above, to determine the magnitude of the temperature dependent boost bias signal 223a. The bias controller or controllers then control the temperature dependent bias circuit 222 by sending temperature dependent bias control signals over the first bias control connection 207a. In some embodiments, the temperature measurement generator 215 generates real-time temperature measurements, which are used along with the standard temperature measurements, to generate real-time varying temperature dependent bias control signals which are sent to the temperature dependent bias circuit 222.

The temperature sensor 212, the temperature measurement generator 215, the controller or controllers, and the temperature dependent bias circuit 222, and the standard bias circuit 224, are calibrated, chosen, and/or configurable, such that as the amplifier circuitry 250 is provided with the appropriate bias until the temperature of the IC die and the temperature of the amplifier circuitry 250 are stable and equalized.

In some embodiments, the temperature measurement is performed by the temperature dependent bias circuit 222 itself. In these embodiments the temperature measurement generator 215 is not present, and the temperature dependent bias circuit 222 is an analogue circuit which utilizes the measured characteristic from the temperature sensor 212, and in some embodiments the temperature sensor 212 forms part of the temperature dependent bias circuit 222.

Figure 2B:
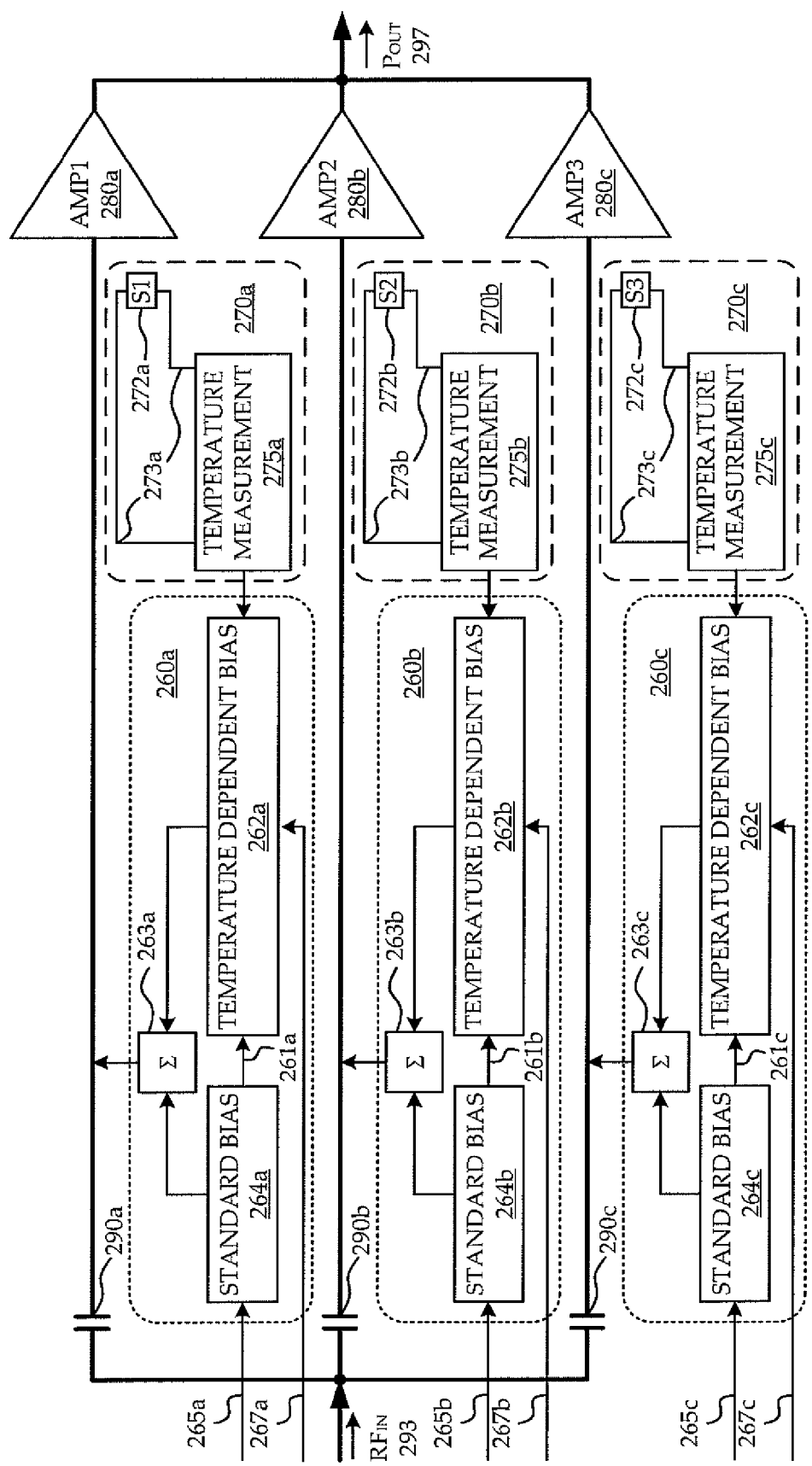
FIG. 2B is a block diagram illustrating temperature dependent biasing in a power amplifier according to an alternative embodiment of the invention.

Referring now also to FIG. 2B a alternative embodiment for improving dynamic EVM will now be described in terms of its structure.

The embodiment depicted in FIG. 2B includes three parallel amplifying pathways each with its own amplifier circuitry, bias circuitry, and temperature sensing circuitry. A total RF input signal 293 is split into three signals, each of which passes through an amplifying pathway and is recombined into a total RF output signal 297.

Receiving one of the three split signals, each amplifying pathway comprises a capacitor 290a, 290b, 290c, in series along the RF signal pathway with respective amplifier circuitry 280a, 280b, 280c which outputs are connected together. The input of each amplifier circuitry 280a, 280b, 280c is connected to an output of a combiner 263a, 263b, 263e, of respective bias circuitry 260a, 260b, 260c. One of two outputs of each combiner 263a, 263b, 263c is respectively connected to a temperature dependent bias circuit 262a, 262b, 262c and a standard bias circuit 264a, 264b, 264c. Each standard bias circuit 264a, 264b, 264c is connected to the respective temperature dependent bias circuit 262a, 262b, 262c, via a standard temperature measurement output line 261a, 261b, 261c. Each standard bias circuit 264a, 264b, 264c, is connected over a respective control line 265a, 265b, 265c to one or more bias controller or controllers. Each temperature dependent bias circuit 262a, 262b, 262c, is also connected over a respective control line 267a, 267b, 267c to one or more bias controller or controllers. Each temperature dependent bias circuit 262a, 262b, 262c is connected to a respective temperature measurement circuit 275a, 275b, 275c of respective temperature sensing circuitry 270a, 270b, 270c. Each temperature measurement circuit 275a, 275b, 275c is connected by respective temperature measurement connections 273a, 273b, 273c to a respective temperature sensor 272a, 272b, 272c of the respective temperature sensing circuitry 270a, 270b, 270c.

Each of the amplifying pathways depicted in FIG. 2B functions in substantially the same manner as the embodiment discussed in association with FIG. 2A.

Temperature measurements from the standard bias circuit 264a, 264b, 264c and the respective temperature sensing circuitry 270a, 270b, 270c are utilized, as described above, to determine a temperature dependent boost bias signal provided by the temperature dependent bias circuit 262a, 262b, 262c for combining in the combiner 263a, 263b, 263c with a standard bias signal from the standard bias circuit 264a, 264b, 264c. Instead of the total bias signal emerging from the combiner 263a, 263b, 263c being input to a special bias input of the amplifier circuitry it is input to the input port of the amplifier circuitry 280a, 280h, 280c.

Figure 3:
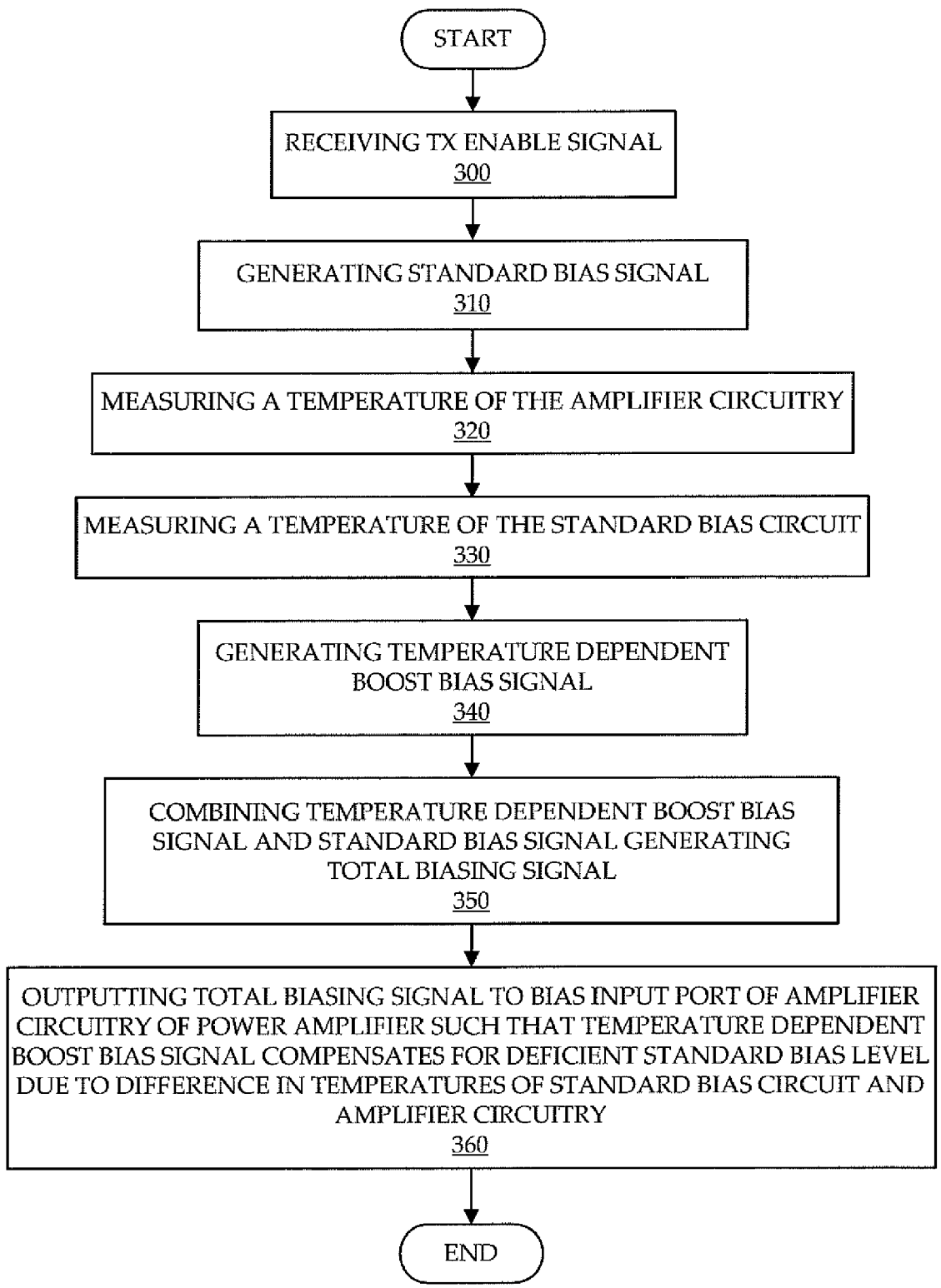
FIG. 3 is a functional block diagram illustrating a method of temperature dependent biasing of a power amplifier according to an embodiment of the invention.

Referring to FIG. 3, a method of temperature dependent biasing according to an embodiment of the invention will now be described. At step 300 the power amplifier receives a Tx enable signal. At step 310 the temperature of a standard bias circuit is measured. At step 320 a standard bias signal is generated by the standard bias circuit. At step 330 the temperature of the amplifier circuitry is measured. A temperature dependent bias circuit generates at step 340 a temperature dependent boost bias signal which depends upon the measured temperatures of the amplifier circuitry and the standard bias circuit such that the temperature dependent boost bias signal compensates for the deficiency in the standard bias signal due to the difference in temperature measured at the standard bias circuit or the bandgap sensor from the actual temperature of the amplifier circuitry. At step 350 a bias circuitry likely including a combiner combines the temperature dependent boost bias signal and the standard bias signal generating a total biasing signal. At step 360 the total biasing signal is output to a bias input port of amplifier circuitry of the power amplifier, such that the temperature dependent boost bias signal compensates for the deficient standard bias level which is due to the difference in the temperature measured at the standard bias circuit or bandgap sensor and the actual temperature of the amplifier circuitry.

In some embodiments, such as that depicted in FIG. 2B, temperature sensing circuitry is utilized in a number of amplification stages of a multistage power amplifier. In some of these embodiments, each stage may function to measure and vary its own temperature dependent boost bias signal as described hereinabove, while in others, temperatures measured at amplifier circuitries of any of the amplification stages may be utilized to vary the temperature dependent biasing of any of the other amplification stages. In such an embodiment, a temperature measuring circuit (for example 270a of FIG. 2B) may be connected to a controller or controllers (not shown) which issue its operation and controls all of the temperature dependent bias circuits 262a, 262b, 262c. Such may be used in an amplifier in which the EVM caused at a particular amplification stage (for example the largest) is preferably corrected by varying a biasing, and amplification produced at a different amplification stage (for example the smallest). Such an implementation may be preferable due to greater sensitivity of control, or faster response times etc. afforded by the smaller amplification stage.

Advantageously, for any standard where packet equalization and estimation occurs at the beginning of each packet, such as IEEE Standard 802.11a, 802.11g, etc., a PA implementing the temperature dependent biasing of the embodiments described hereinabove, exhibits a constant and settled gain and phase response while a temperature differential exists between the amplifying circuitry in the biasing circuitry, causing the EVM of the whole packet including the preamble and the header of the packet, to remain unaffected by the temperature differential across the IC die of the PA.

In some embodiments of the invention, dynamic EVM improving circuitry including the temperature sensing circuitry 210, the temperature dependent bias circuit 222, the combiner 227, the first bias control connection 207a, the temperature output connection or connections 208, and the standard temperature measurement connection or connections 203 can be added to existing known bias circuits with simple retrofit to design refreshes. Consequently, embodiments of the invention may be obtained in the act of improving existing bias circuits by wrapping the dynamic EVM improving circuitry described hereinabove around the existing bias circuits.

The embodiments depicted in FIG. 1, FIG. 2A, and FIG. 2B may be implemented using, for both the temperature dependent bias circuit 222 and the standard bias circuit 224, existing proven bias structures.

It should be understood that, although the bias circuitry 220 has been depicted as comprising separate temperature dependent bias and standard bias circuits 222 224 which produce respectively a temperature dependent boost bias signal and a standard bias signal which are added together in the bias circuitry 220, other embodiments comprise custom bias circuitry which generates a single bias signal equivalent to the combination of the temperature dependent boost bias signal and the standard bias signal of the embodiment depicted in FIG. 1, FIG. 2A, and FIG. 2B.

The embodiments of the invention have been described in terms of providing various biasing signals, and it should be understood that biasing signals include the use of biasing currents or biasing voltages depending upon the biasing implementation of the amplifier circuitry, and in particular whether it is configured to accept a voltage or a current input at the bias input port of the amplifier circuitry.

The embodiments presented are exemplary only and persons skilled in the art would appreciate that variations to the embodiments described above may be made without departing from the invention. The scope of the invention is solely defined by the appended claims.

What is claimed is:

1. A method of biasing in a power amplifier, the method comprising:
measuring a temperature of amplifier circuitry of the power amplifier with use of a temperature sensor located proximate the amplifier circuitry generating at least one temperature measurement;
generating a temperature dependent bias signal in dependence upon the at least one temperature measurement;
providing the temperature dependent bias signal to a bias input port of the amplifier circuitry,
wherein the temperature dependent bias signal has a magnitude other than a magnitude of a standard bias signal generated in dependence upon at least one standard temperature measurement generated from at least one of a measurement of a temperature of a bias circuit of the power amplifier and a measurement representative of a temperature of the power amplifier, and wherein the temperature dependent bias signal is sufficient to bias the amplifier circuitry to a desired gain and phase.

2. A method according to claim 1 wherein generating the temperature dependent bias signal comprises:
generating a temperature dependent boost bias signal in dependence upon the at least one temperature measurement;
generating the standard bias signal in dependence upon the at least one standard temperature measurement; and
combining the temperature dependent boost bias signal and the standard bias signal to generate the temperature dependent bias signal.

3. A method of biasing according to claim 2 wherein the temperature dependent boost bias signal compensates for a shortfall of magnitude of the standard bias signal caused by a difference between the at least one standard temperature measurement and the actual temperature of the amplifier circuitry.

4. A method of biasing according to claim 3 wherein generating the temperature dependent boost bias signal comprises:
determining an appropriate magnitude for the temperature dependent bias signal to bias the amplifier circuitry to the desired gain and phase, in dependence upon the at least one temperature measurement;
determining the magnitude of the standard bias signal in dependence upon the at least one standard temperature measurement;
determining a bias signal difference between the appropriate magnitude for the temperature dependent bias signal and the magnitude of the standard bias signal; and
setting the magnitude of the temperature dependent boost bias signal to a magnitude of the bias signal difference.

5. A method of biasing according to claim 3 wherein generating the temperature dependent boost bias signal comprises;
determining a temperature measurement difference between the at least one temperature measurement and the at least one standard temperature measurement;
determining a bias signal difference with use of the temperature measurement difference; and
setting the magnitude of the temperature dependent boost bias signal to a magnitude of the bias signal difference.

6. A method of biasing according to claim 5 wherein determining a bias signal difference with use of the temperature measurement difference comprises:
generating a bias signal difference determined using the temperature difference and one of:
a function of the temperature measurement difference; and
a lookup table of temperature measurement differences and corresponding bias signal differences.

7. A method of biasing according to claim 4 further comprising:
dynamically generating the temperature dependent boost bias signal in dependence upon the at least one temperature measurement such that the temperature dependent bias signal is sufficient to bias the amplifier circuitry to a desired gain and phase,
wherein the dynamic generation commences on receipt of RF signal data by the amplifier circuitry and concludes when the at least one temperature measurement is equal to the at least one standard temperature measurement.

8. A method of biasing according to claim 7 wherein dynamically generating the temperature dependent boost bias signal comprises:

generating the temperature dependent boost bias signal as a time evolving signal profile following one of a functionally defined signal profile and stored signal profile values in dependence upon a single bias signal difference determined at a specific time, wherein the time evolving signal profile has a maximum value when it is expected that a measured temperature difference between the temperature of the amplifying circuitry and at least one of the temperature of the bias circuit and a measurement representative of a temperature of the power amplifier is at a maximum, and wherein the time evolving signal profile falls to zero as the measured temperature difference vanishes.

9. A method of biasing according to claim 7 wherein measuring a temperature of the amplifier circuitry comprises dynamically measuring the instantaneous temperature of the amplifier circuitry, and wherein the at least one temperature measurement comprises dynamic temperature measurements each representing an instantaneous temperature of the amplifier circuitry, wherein the at least one standard temperature measurement further comprises at least one of dynamic measurements of the instantaneous temperature of the bias circuit and dynamic measurements representative of an instantaneous temperature of the power amplifier, and wherein dynamically generating the temperature dependent bias signal comprises:

continuously determining an appropriate instantaneous magnitude for the temperature dependent bias signal to bias the amplifier circuitry to a desired gain and phase, in dependence upon the at least one temperature measurement;

continuously determining the instantaneous magnitude of the standard bias signal in dependence upon the at least one standard temperature measurement;

continuously determining an instantaneous bias signal difference between the appropriate instantaneous magnitude for the temperature dependent bias signal and the instantaneous magnitude of the standard bias signal; and continuously setting an instantaneous magnitude of the temperature dependent boost bias signal to a magnitude of the instantaneous bias signal difference.

10. A method of biasing according to claim 7 wherein measuring a temperature of the amplifier circuitry comprises dynamically measuring the instantaneous temperature of the amplifier circuitry, and wherein the at least one temperature measurement comprises dynamic temperature measurements each representing the instantaneous temperature of the amplifier circuitry, wherein the at least one standard temperature measurement further comprises at least one of dynamic measurements of the instantaneous temperature of the bias circuit and dynamic measurements representative of an instantaneous temperature of the power amplifier, and wherein dynamically generating the temperature dependent bias signal comprises:

continuously determining an instantaneous temperature difference between the at least one temperature measurement and the at least one standard temperature measurement;

continuously determining an instantaneous bias signal difference with use of the instantaneous temperature difference; and continuously setting an instantaneous magnitude of the temperature dependent boost bias signal to a magnitude of the instantaneous bias signal difference.

11. A method of biasing according to claim 10 wherein continuously determining the instantaneous bias signal difference comprises:

continuously generating the instantaneous bias signal difference determined using the instantaneous temperature difference and one of:

a function of the instantaneous temperature difference; and a lookup table of instantaneous temperature differences and corresponding instantaneous bias signal differences.

12. A circuit for a power amplifier, the circuit comprising:

temperature sensing circuitry comprising a temperature sensor located proximate amplifier circuitry of the power amplifier for measuring a temperature of the amplifier circuitry, the temperature sensing circuitry for generating at least one temperature measurement; and bias circuitry connected to the temperature sensing circuitry and for generating a temperature dependent bias signal in dependence upon the at least one temperature measurement, and for providing the temperature dependent bias signal to a bias input port of the amplifier circuitry, wherein the temperature dependent bias signal has a magnitude other than a magnitude of a standard bias signal generated in dependence upon at least one standard temperature measurement generated from at least one of a measurement of a temperature of the bias circuitry and a measurement representative of a temperature of the power amplifier, and wherein the temperature dependent bias signal is sufficient to bias the amplifier circuitry to a desired gain and phase.

13. A circuit according to claim 12 wherein the temperature dependent bias circuit comprises:

a temperature dependent bias circuit connected to the temperature sensing circuitry for generating a temperature dependent boost bias signal in dependence upon the at least one temperature measurement;

a standard bias circuit for generating the standard bias signal in dependence upon the at least one standard temperature measurement; and a combiner connected to the temperature dependent bias circuit and the standard bias circuit for combining the temperature dependent boost bias signal and the standard bias signal to generate the temperature dependent bias signal.

14. A circuit according to claim 13 wherein the temperature dependent boost bias signal compensates for a shortfall of magnitude of the standard bias signal caused by a difference between the at least one standard temperature measurement and the actual temperature of the amplifier circuitry.

15. A circuit according to claim 14 wherein the temperature dependent bias circuit is connected to the standard bias circuit for receiving the at least one standard temperature measurement, wherein the temperature dependent bias circuit is for determining an appropriate magnitude for the temperature dependent bias signal to bias the amplifier circuitry to the desired gain and phase in dependence upon the at least one temperature measurement received from the temperature measurement circuitry, for determining the magnitude of the standard bias signal in dependence upon the at least one standard temperature measurement received from the standard bias circuit, for determining a bias signal difference between the appropriate magnitude for the temperature dependent bias signal and the magnitude of the standard bias signal, and for setting the magnitude of the temperature dependent boost bias signal to a magnitude of the bias signal difference.

16. A circuit according to claim 14 wherein the temperature dependent bias circuit is connected to the standard bias circuit for receiving the at least one standard temperature measurement, and is for determining a temperature measurement difference between the at least one temperature measurement received from the temperature measurement circuitry and the at least one standard temperature measurement received from the standard bias circuit, for determining a bias signal difference with use of the temperature measurement difference, and for setting the magnitude of the temperature dependent boost bias signal to a magnitude of the bias signal difference.

17. A circuit according to claim 16 wherein the temperature dependent bias circuit determines the bias signal difference with use of the temperature measurement difference by generating a bias signal difference determined using the temperature measurement difference and one of:
  a function of the temperature measurement difference; and
  a lookup table of temperature measurement differences and corresponding bias signal differences.

18. A circuit according to claim 15 wherein the temperature dependent bias circuit is further for dynamically generating the temperature dependent boost bias signal in dependence upon the at least one temperature measurement such that the temperature dependent bias signal is sufficient to bias the amplifier circuitry to the desired gain and phase, wherein the dynamic generation commences on receipt of RF signal data by the amplifier circuitry and concludes when the at least one temperature measurement is equal to the at least one standard temperature measurement.

19. A circuit according to claim 18 wherein the temperature dependent bias circuit dynamically generates the temperature dependent boost bias signal by:
  generating the temperature dependent boost bias signal as a time evolving signal profile following one of a functionally defined signal profile and stored signal profile values in dependence upon a single bias signal difference determined at a specific time,
wherein the time evolving signal profile has a maximum value when it is expected that a measured temperature difference between the temperature of the amplifying circuitry and at least one of the temperature of the bias circuit and a measurement representative of a temperature of the power amplifier is at a maximum, and wherein the time evolving signal profile falls to zero as the measured temperature difference vanishes.

20. A circuit according to claim 18 wherein the temperature dependent bias circuit measures a temperature of the amplifier circuitry by dynamically measuring the instantaneous temperature of the amplifier circuitry, and wherein the at least one temperature measurement comprises dynamic temperature measurements each representing an instantaneous temperature of the amplifier circuitry, wherein the at least one standard temperature measurement further comprises at least one of dynamic measurements of the instantaneous temperature of the bias circuit and dynamic measurements representative of an instantaneous temperature of the power amplifier, and wherein the temperature dependent bias circuit dynamically generates the temperature dependent bias signal by:
  continuously determining an appropriate instantaneous magnitude for the temperature dependent bias signal to bias the amplifier circuitry to a desired gain and phase, in dependence upon the at least one temperature measurement received from the temperature measurement circuitry;
  continuously determining the instantaneous magnitude of the standard bias signal in dependence upon the at least one standard temperature measurement received from the standard bias circuit;
  continuously determining an instantaneous bias signal difference between the appropriate instantaneous magnitude for the temperature dependent bias signal and the instantaneous magnitude of the standard bias signal; and
  continuously setting an instantaneous magnitude of the temperature dependent boost bias signal to a magnitude of the instantaneous bias signal difference.

21. A circuit according to claim 18 wherein the temperature measurement circuitry measures a temperature of the amplifier circuitry by dynamically measuring the instantaneous temperature of the amplifier circuitry, and wherein the at least one temperature measurement comprises dynamic temperature measurements each representing an instantaneous temperature of the amplifier circuitry, wherein the at least one standard temperature measurement further comprises at least one of dynamic measurements of the instantaneous temperature of the bias circuit and dynamic measurements representative of an instantaneous temperature of the power amplifier, and wherein the temperature dependent boost bias circuit dynamically generates the temperature dependent bias signal by:
  continuously determining an instantaneous temperature difference between the at least one temperature measurement and the at least one standard temperature measurement;
  continuously determining an instantaneous bias signal difference with use of the instantaneous temperature difference; and
  continuously setting an instantaneous magnitude of the temperature dependent boost bias signal to a magnitude of the instantaneous bias signal difference.

22. A circuit according to claim 21 wherein the temperature dependent boost bias circuit continuously determines the instantaneous bias signal difference by:
  continuously generating the instantaneous bias signal difference determined using the instantaneous temperature difference and one of:
    a function of the instantaneous temperature difference; and
    a lookup table of instantaneous temperature differences and corresponding instantaneous bias signal differences.

23. A circuit according to claim 12 further comprising:
  at least one controller connected to the bias circuitry, for generating temperature dependent bias control signals in dependence upon the at least one temperature measurement, for controlling the bias circuitry with use of the temperature dependent bias control signals.

24. A circuit according to claim 12 wherein the temperature sensor comprises one of a semiconductor diode and a thermocouple.

25. A circuit for a power amplifier for RF communication, the circuit comprising:
  temperature sensing circuitry for sensing a temperature of integrated amplifier circuitry of the power amplifier, and for generating a temperature signal in dependence upon said temperature, the temperature sensing circuitry comprising a temperature sensor formed in an integrated chip die material in which the amplifier circuitry is integrated and located proximate the amplifier circuitry; and
  a temperature dependent bias circuit for generating a temperature dependent bias signal in dependence upon the temperature signal, the temperature dependent bias circuit coupled to a bias input port of the amplifier circuitry and for providing the temperature dependent bias signal to the bias input port, wherein the temperature dependent bias signal has a magnitude other than a magnitude of a standard bias signal generated in dependence upon at least one standard temperature measurement generated from at least one of a measurement of a temperature of the bias circuitry and a measurement representative of a temperature of the power amplifier, and wherein the temperature dependent bias signal is sufficient to bias the amplifier circuitry to a desired gain and phase.

26. A method of biasing in a power amplifier for RF communication, the method comprising:
generating a temperature signal in dependence upon a temperature of first amplifier circuitry of a first amplification stage of the power amplifier with use of a temperature sensor located proximate the amplifier circuitry;
generating a temperature dependent bias signal in dependence upon the temperature signal; and
providing the temperature dependent bias signal to a bias input port of second amplifier circuitry of a second amplification stage of the power amplifier,
wherein the temperature dependent bias signal is generated and output to the bias input port of the second amplifier circuitry, wherein the temperature dependent bias signal has a magnitude other than a magnitude of a standard bias signal generated in dependence upon at least one standard temperature measurement generated from at least one of a measurement of a temperature of the bias circuitry and a measurement representative of a temperature of the power amplifier, and wherein the temperature dependent bias signal is sufficient to bias the second amplifier circuitry to a desired gain and phase.

* * * * *